United States Patent
Tsuda

(10) Patent No.: US 9,976,721 B2
(45) Date of Patent: May 22, 2018

(54) LIGHT SOURCE MODULE

(71) Applicant: KOITO MANUFACTURING CO., LTD., Tokyo (JP)

(72) Inventor: Toshiaki Tsuda, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 78 days.

(21) Appl. No.: 15/065,399

(22) Filed: Mar. 9, 2016

(65) Prior Publication Data
US 2016/0265736 A1    Sep. 15, 2016

(30) Foreign Application Priority Data
Mar. 11, 2015    (JP) ................. 2015-048588

(51) Int. Cl.
*F21V 29/00* (2015.01)
*F21S 8/10* (2006.01)
*H01S 5/40* (2006.01)
*F21Y 115/30* (2016.01)

(52) U.S. Cl.
CPC ......... *F21S 48/328* (2013.01); *F21S 48/1104* (2013.01); *F21S 48/1109* (2013.01); *F21S 48/1145* (2013.01); *H01S 5/40* (2013.01); *F21Y 2115/30* (2016.08)

(58) Field of Classification Search
CPC ............... F21S 48/1104; F21S 48/1109; F21S 48/1145; F21S 48/115; F21S 48/1154; F21S 48/1159; F21S 48/32; F21S 48/328; H01S 5/40
USPC .......................................... 362/294, 543–549
See application file for complete search history.

(56) References Cited

U.S. PATENT DOCUMENTS 6,406,173 B1 * 6/2002 Serizawa ............ B60Q 1/2696
                                                     362/238
2007/0041195 A1 * 2/2007 Chen ........................ F21K 9/00
                                                     362/294

FOREIGN PATENT DOCUMENTS

| CN | 2733594 Y | 10/2005 |
| EP | 2346100 A2 | 7/2011 |
| EP | 2584395 A1 | 4/2013 |
| JP | 2006-278361 A | 10/2006 |
| WO | 2012114241 A2 | 8/2012 |

OTHER PUBLICATIONS

Office Action issued in corresponding Chinese Application No. 201610127401.2, dated Dec. 4, 2017 (14 pages).
Search Report issued in corresponding French Application No. 1652018, dated Mar. 22, 2018 (8 pages).

* cited by examiner

*Primary Examiner* — Jason Moon Han
(74) *Attorney, Agent, or Firm* — Osha Liang LLP

(57) ABSTRACT

A light source module includes a light source which comprises a light emitting element, a stem configured to support the light emitting element, and a terminal having one end electrically connected to the light emitting element, a wiring board to which the other end of the terminal is electrically connected and which is configured to electrically connect the terminal to an external power supply terminal, and a thermal diffusion member which is disposed between the stem and the wiring board and is thermally connected to the light emitting element.

4 Claims, 6 Drawing Sheets

LIGHT SOURCE MODULE

CROSS-REFERENCE TO RELATED APPLICATION

The present application claims priority from Japanese Patent Application No. 2015-048588 filed on Mar. 11, 2015, the entire content of which is incorporated herein by reference.

BACKGROUND

Technical Field

The present invention relates to a light source module and, more particularly, to a light source module used in a lamp of a vehicle such as an automobile.

Related Art

A related-art light source module has a structure where a laser light source including a laser element and a metal stem on which the laser element is mounted and is mounted on a circuit board (e.g., see Patent Document 1). In the light source module, the laser light source is connected to the circuit board in a state of being press-fitted into a hole of a metal heat-dissipation plate. A side surface of the stem is in contact with a side surface of the hole of the heat-dissipation plate, so that heat of the laser light source is transferred to the heat-dissipation plate from the side surface of the stem.

Patent Document 1: Japanese Patent Laid-Open Publication No. 2006-278361

The present inventor have extensively studied about the related-art light source module described above and, as a result, have found that there is a room to improve heat dissipation of the light source in the related-art light source module.

SUMMARY

Exemplary embodiments of the invention provide a light source module which can improve heat dissipation of a light source.

One aspect of the present invention is a light source module. The light source module comprises:

a light source which comprises a light emitting element, a stem configured to support the light emitting element, and a terminal having one end electrically connected to the light emitting element;

a wiring board to which the other end of the terminal is electrically connected and which is configured to electrically connect the terminal to an external power supply terminal; and a thermal diffusion member which is disposed between the stem and the wiring board and is thermally connected to the light emitting element.

According to this aspect, it is possible to improve heat dissipation of the light source.

The thermal diffusion member may have a first surface facing the wiring board, a second surface facing the wiring board and located at a position spaced apart from the wiring board than the first surface, and a through hole extending from the second surface to a surface on the light source side. The wiring board may be arranged such that an end region of the wiring board is overlapped with the second surface, as seen from a stacked direction of the light source, the thermal diffusion member and the wiring board. The terminal may be inserted through the through hole and is electrically connected to the wiring board at the end region.

According to this aspect, it is possible to suppress connection reliability between the light source and the wiring board from being decreased.

The light source module may further comprise a flexible insulation member disposed between the second surface and the end region.

According to this aspect, it is possible to secure electrical insulation between the wiring board and the thermal diffusion member.

The wiring board and the terminal may be fixed to each other by a connection member. The terminal may have a bent portion which is deformed in accordance with dimensional change in at least one of the thermal diffusion member, the terminal, the wiring board and the connection member.

According to this aspect, it is possible to further suppress connection reliability between the light source and the wiring board from being decreased.

The thermal diffusion member may have a connection surface which is connected to a heat sink, and the connection surface may be located at a position spaced apart from the light source than the wiring board.

According to this aspect, it is possible to enhance the degree of freedom in the arrangement of the heat sink.

According to the present invention, it is possible to provide a technology capable of improving heat dissipation of a light source.

DETAILED DESCRIPTION

Figure 1:
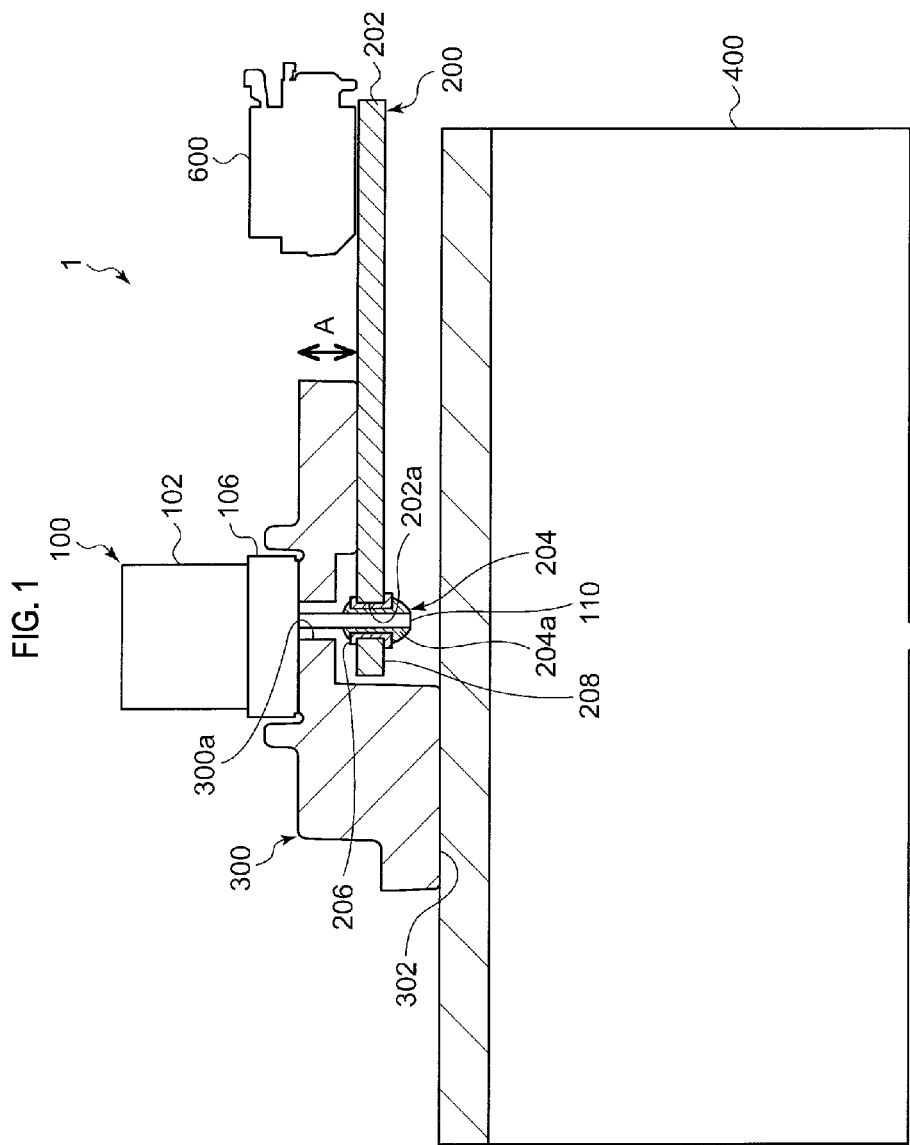
FIG. 1 is a sectional view showing a schematic structure of a light source module according to a first embodiment.

Hereinafter, exemplary embodiments of the present invention will be described with reference to the drawings. The same or similar elements, members and process shown in each of the drawings are denoted by the same or similar reference numerals and a duplicated description thereof will be omitted, as appropriate. Further, the embodiment is illustrative and not intended to limit the present invention. It should be noted that all the features and their combinations described in the embodiment are not necessarily considered as an essential part of the present invention.

First Embodiment

Figure 2:
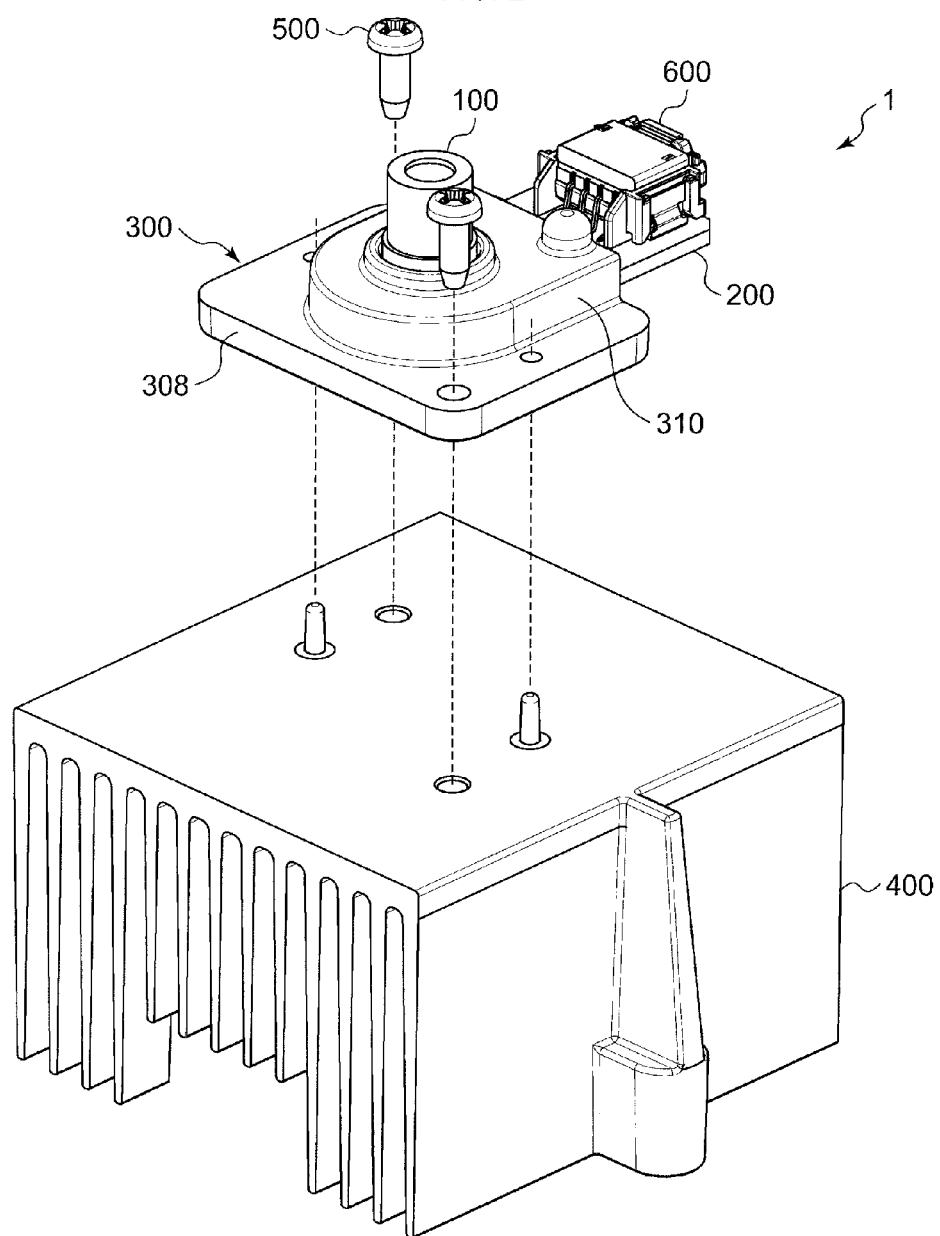
FIG. 2 is a perspective view showing a schematic structure of the light source module according to the first embodiment.
Figure 3:
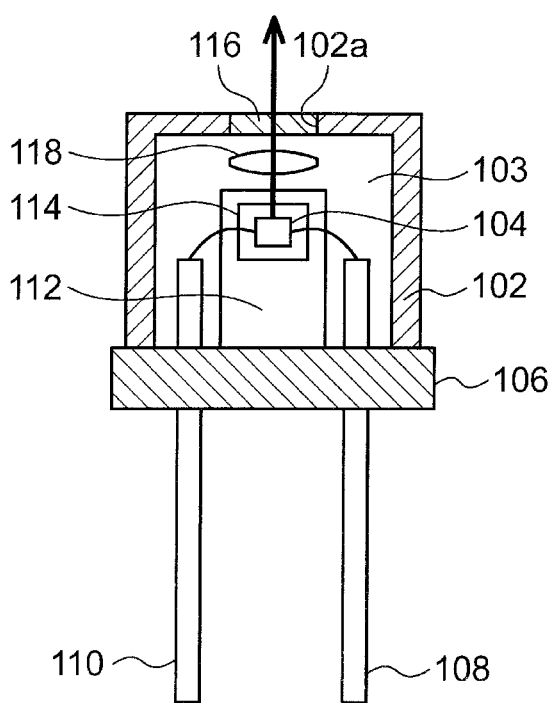
FIG. 3 is a sectional view showing a schematic structure of a light source.

FIG. 1 is a sectional view showing a schematic structure of a light source module according to a first embodiment. In FIG. 1, internal structures of a light source 100 and an external power supply terminal 600 are not shown. Further, the portion of a wiring pattern excluding a land portion 206 is not shown. FIG. 2 is a perspective view showing a schematic structure of the light source module according to the first embodiment. FIG. 3 is a sectional view showing a schematic structure of the light source. A light source module 1 according to the present embodiment is used in a vehicle lamp, for example. As shown in FIGS. 1 and 2, the light source module 1 includes the light source 100, a wiring board 200, and a thermal diffusion member 300.

As shown in FIGS. 1 to 3, the light source 100 includes, as a main configuration, a cap 102, a light emitting element 104, a stem 106, and at least two terminals 108, 110. The light source 100 is, for example, a related-art CAN package. That is, the light source 100 has a structure that the terminals 108, 110 extend to the outside through the stem 106 from a space to accommodate the light emitting element 104. Therefore, the terminals 108, 110 protrude from a main surface of the stem 106, which is a main heat-dissipating surface of the light source 100. The light source 100 excites a phosphor by a laser, thereby producing white light.

Specifically, the light source 100 has an internal space 103 formed by the cap 102 and the stem 106. The light emitting element 104 is accommodated in the internal space 103. The internal space 103 is hermetically sealed. The light emitting element 104 is a related-art laser element and the wavelength of the laser light thereof is in a range of 380~470 nm, for example. The stem 106 is a plate-like metal member and supports the light emitting element 104. Specifically, a heat-dissipation block 112 is fixed to the surface of the stem 106, which is in contact with the internal space 103. Further, a sub-mount 114 is fixed to the heat-dissipation block 112, and the light emitting element 104 is mounted on the sub-mount 114. Therefore, the stem 106 supports the light emitting element 104 through the heat-dissipation block 112 and the sub-mount 114.

One electrode of the light emitting element 104 is electrically connected to one end of one terminal 108. The other electrode of the light emitting element 104 is electrically connected to one end of the other terminal 110. The terminals 108, 110 are fixed to the stem 106 in a state of being electrically insulated from the stem 106. A window 102a for extracting the light of the light emitting element 104 to the outside is provided on an upper surface of the cap 102. The window 102a is provided with a wavelength conversion portion 116 for converting the wavelength of at least a portion of the light of the light emitting element 104. As the wavelength conversion portion 116, those obtained by dispersing powder phosphor in transparent resin or glass, or a ceramic obtained by sintering the powder phosphor, or the like is exemplified. A lens 118 is provided on an optical path of emission light from the light emitting element 104 between the light emitting element 104 and the wavelength conversion portion 116. The lens 118 is, for example, a collimator lens for converting the light emitted from the light emitting element 104 into parallel light.

The wiring board 200 is a member for electrically connecting the terminals 108, 110 of the light source 100 to the external power supply terminal 600. The wiring board 200 is, for example, a related-art printed wiring board. The wiring board 200 includes a resin board 202 such as a glass epoxy board and a conductive wiring pattern (not shown) formed on the surface of the board 202. Therefore, the wiring board 200 can be elastically deformed to some extent. The board 202 has through holes 202a at a region on which the light source 100 is mounted. The wiring pattern has the land portion 206 at a region on which the light source 100 is mounted. In the present embodiment, the land portion 206 has a through-hole electrode structure which extends from one main surface of the board 202 to the other main surface of the board 202 through an inner wall surface of the through holes 202a. In this way, it is possible to increase the area where the terminals 108, 110 and the land portion 206 are bonded to each other by a connection member 204a.

The other ends of the terminals 108, 110 are inserted into the through holes 202a of the board 202. The other ends of the terminals 108, 110 and the land portion 206 of the wiring pattern are electrically connected to each other by being fixed to each other by the connection member 204a such as a solder. In this way, a connection portion 204 between the wiring board 200 and the terminals 108, 110 is formed.

The external power supply terminal 600 is provided at a predetermined region, for example, at a peripheral edge portion of the board 202. In the present embodiment, the land portion 206 is disposed in an end region 208 of the wiring board 200, and the external power supply terminal 600 is disposed in an end region opposite to the end region 208. A direction in which the land portion 206 and the external power supply terminal 600 are arranged, i.e., an extension direction of the wiring board 200 is a direction intersecting with a stacked direction of the light source 100, the thermal diffusion member 300 and the wiring board 200. Further, in the present embodiment, the external power supply terminal 600 has a connector shape.

An external power supply is connected to the external power supply terminal 600. Further, a wiring (not shown) is electrically connected to the external power supply terminal 600 and the land portion 206. Therefore, when the external power supply is connected to the external power supply terminal 600, power is supplied to the light emitting element 104 via the external power supply terminal 600, the wiring pattern, the connection portion 204 and the terminals 108, 110. Further, a control circuit (not shown) for controlling the output of the light emitting element 104, or a thermistor (not shown) for detecting the temperature of the light source 100, or the like is provided on the board 202.

The thermal diffusion member 300 is made of a material having a high thermal conductivity, such as a metal. As the metal used as the thermal diffusion member 300, aluminum or the like can be exemplified. At least a portion of the thermal diffusion member 300 is disposed between the stem 106 of the light source 100 and the wiring board 200. The thermal diffusion member 300 is thermally connected to the light emitting element 104. The thermal diffusion member 300 is fixed to the wiring board 200 by a fastener (not shown) such as a screw, for example. The thermal diffusion member 300 has through holes 300a at positions corresponding to the through holes 202a of the board 202. The terminals 108, 110 are inserted through the through holes 300a and the through holes 202a, and leading ends thereof are electrically connected to the land portion 206 at the connection portion 204.

The heat generated in the light emitting element 104 can be diffused by the thermal diffusion member 300. The heat generated in the light emitting element 104 is transferred to the thermal diffusion member 300 via the sub-mount 114, the heat-dissipation block 112 and the stem 106. The thermal diffusion member 300 is in contact with the main surface of the stem 106. Therefore, it is possible to increase the contact area between the stem 106 and the thermal diffusion member 300, as compared to a case where the thermal diffusion member 300 is in contact with only the side surface of the stem 106. Accordingly, it is possible to increase the heat dissipation of the light source 100.

The thermal diffusion member 300 has a connection surface 302 connected to a heat sink 400. The thermal diffusion member 300 and the heat sink 400 are fixed to each other by fasteners 500 such as screws in the state where the heat sink 400 is in contact with the connection surface 302. The heat transferred to the thermal diffusion member 300 is dissipated mainly through the heat sink 400. The connection surface 302 is arranged at a position spaced apart from the light source 100 than the wiring board 200. In this way, by shifting the position of the connection surface 302 with respect to the position of the wiring board 200 in the stacked direction of the light source 100, the thermal diffusion member 300 and the wiring board 200, the heat sink 400 and the wiring board 200 can be prevented from being interfered with each other. Therefore, the degree of freedom in the arrangement of the heat sink 400 is enhanced and the size of the heat sink 400 can be increased.

Subsequently, the shape of the thermal diffusion member 300 and the arrangement of the wiring board 200 are described in more detail. As described above, the thermal diffusion member 300 is sandwiched between the wiring board 200 and the stem 106. When the thermal diffusion member 300 is disposed between the wiring board 200 and the stem 106 in this way, it is possible to improve heat dissipation of the light source 100.

However, at the time of temperature rise due to the heat of the light source 100 and temperature drop due to the heat dissipation, the thermal diffusion member 300 is expanded or contracted, and hence, the dimension thereof is changed. In the above-described structure, for example, when the thermal diffusion member 300 is expanded, and thus, the dimension thereof is increased, a force A (force in a direction indicated by an arrow A in FIG. 1) of widening a gap between the light source 100 and the connection portion 204 occurs in the light source module 1. Similarly, the terminals 108, 110, the wiring board 200 and the connection member 204a are expanded or contracted with the temperature change due to the absorption and dissipation of heat, and hence, the dimensions thereof are changed. The force A may also occur in accordance with this dimensional change. When the force A occurs, stress is applied to the connection portion 204. As a result, crack or the like occurs in the connection member 204, and hence, there is a possibility that connection reliability between the light source 100 and the wiring board 200 is decreased.

Figure 4:
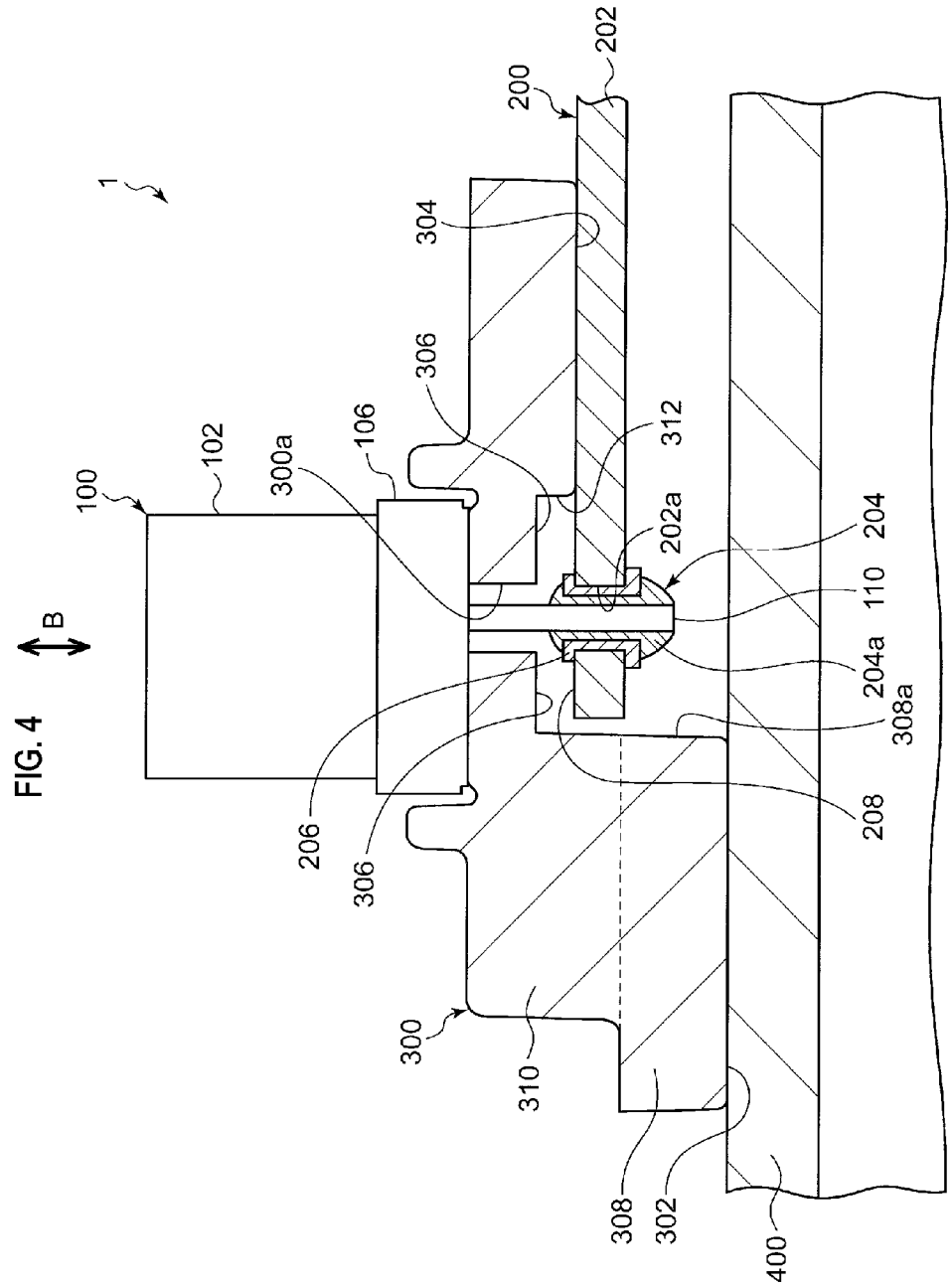
FIG. 4 is an enlarged sectional view showing the vicinity of a connection portion of the light source module according to the first embodiment.

On the other hand, the light source module 1 of the present embodiment has a structure described below. FIG. 4 is an enlarged sectional view showing the vicinity of the connection portion of the light source module according to the first embodiment. In FIG. 4, the internal structure of the light source 100 and the portion of the wiring pattern excluding the land portion 206 are not shown.

As shown in FIG. 4, the thermal diffusion member 300 has a first surface 304 facing the wiring board 200 and a second surface 306 facing the wiring board 200 and located at a position spaced apart from the wiring board 200 than the first surface 304. In the present embodiment, the first surface 304 is in direct contact with the wiring board 200. However, another member may be interposed between the first surface 304 and the wiring board 200.

That is, as shown in FIGS. 2 and 4, the thermal diffusion member 300 includes a substantially flat base portion 308 having a cutout portion 308a and a covering portion 310 protruding toward the light source 100 from the base portion 308 and covering the cutout portion 308a. The base portion 308 has the connection surface 302. The light source 100 is mounted on one main surface of the covering portion 310. An insertion portion for the wiring board 200 is formed by an inner surface of the cutout portion 308a and the other main surface of the covering portion 310. A concave portion 312 is provided in the other main surface of the covering portion 310. A bottom surface of the concave portion 312 is the second surface 306. Further, the region of the other main surface of the covering portion 310 other than the region where the concave portion 312 is provided is the first surface 304. The through hole 300a is provided in the covering portion 310 and extends from the second surface 306 to the surface of the covering portion 310 on the light source 100 side.

The end region 208 side of the wiring board 200, on which the land portion 206 is disposed, is inserted into the insertion portion. Therefore, the wiring board 200 is arranged such that the end region 208 is overlapped with the second surface 306, as seen from a stacked direction B (direction indicated by an arrow B in FIG. 4) of the light source 100, the thermal diffusion member 300 and the wiring board 200. Further, the terminals 108, 110 are inserted through the through hole 300a and the through hole 202a and are electrically connected to the land portion 206 of the wiring board 200 at the end region 208. The wiring board 200 is fixed to the first surface 304 of the thermal diffusion member 300 by fasteners (not shown) such as screws, for example. The end region 208 is, for example, a region from an end (outermost end) of the board 202 to the land portion 206.

The second surface 306 is spaced apart from the wiring board 200, as compared to the first surface 304. Therefore, in the state where the wiring board 200 is fixed to the thermal diffusion member 300, a clearance corresponding to at least a depth of the concave portion 312 occurs between the end region 208 and the second surface 306. Further, the end region 208 is not fixed in the insertion portion but is configured as a free end. Therefore, the end region 208 of the wiring board 200 can be displaced by its own elasticity in accordance with the dimensional change in at least one of the thermal diffusion member 300, the terminals 108, 110, the wiring board 200 and the connection member 204.

Specifically, when the force A occurs in accordance with the dimensional change in at least one of the thermal diffusion member 300, the terminals 108, 110, the wiring board 200 and the connection member 204a, a displacement force in a direction in which the light source 100 and the wiring board 200 are arranged is applied to the connection portion 204. When the force is applied to the connection portion 204, the wiring board 200 is elastically deformed with the portion in contact with the first surface 304 as a pivot point and the end region 208 is displaced. In this way, the connection portion 204 is allowed to be displaced in accordance with the dimensional change in at least one of the thermal diffusion member 300, the terminals 108, 110, the wiring board 200 and the connection member 204a. As a result, stress applied to the connection portion 204 is alleviated. That is, the wiring board 200 serves as a stress alleviation mechanism for alleviating the stress applied to the connection portion 204 in accordance with the dimensional change in at least one of the thermal diffusion member 300, the terminals 108, 110, the wiring board 200 and the connection member 204a. Further, since a clearance occurs between the end region 208 and the second surface 306, it is possible to secure electrical insulation between the land portion 206 and the thermal diffusion member 300.

As described above, the light source module 1 according to the present embodiment includes the thermal diffusion member 300 which is disposed between the stem 106 and the wiring board 200 and is thermally connected to the light emitting element 104. In this way, it is possible to increase the contact area between the stem and the thermal diffusion member, as compared to the case where the thermal diffusion member is in contact with the side of the stem as in the related art. As a result, it is possible to improve heat dissipation of the light source 100.

Further, the thermal diffusion member 300 has the first surface 304 facing the wiring board 200 and the second surface 306 facing the wiring board 200 and located at a position spaced apart from the wiring board 200 than the first surface 304. The wiring board 200 is arranged such that the surface of the end region 208 facing the thermal diffusion member 300 faces the second surface 306. Further, the terminals 108, 110 are electrically connected to the wiring board 200 at the end region 208. Thereby, the end region 208 can be displaced in accordance with the dimensional change in at least one of the thermal diffusion member 300, the terminals 108, 110, the wiring board 200 and the connection member 204a. As a result, it is possible to suppress connection reliability between the light source 100 and the wiring board 200 from being decreased. Therefore, it is possible to achieve both improvement in the heat dissipation of the light source 100 and prevention of decrease in the connection reliability between the light source 100 and the wiring board 200.

Second Embodiment

A light source module 1 according to a second embodiment has the same configuration as the light source module 1 according to the first embodiment except that a flexible member 700 is further provided. Hereinafter, the light source module 1 according to the second embodiment will be described by focusing on the configurations different from the first embodiment, and the common configurations will be briefly described or omitted.

Figure 5:
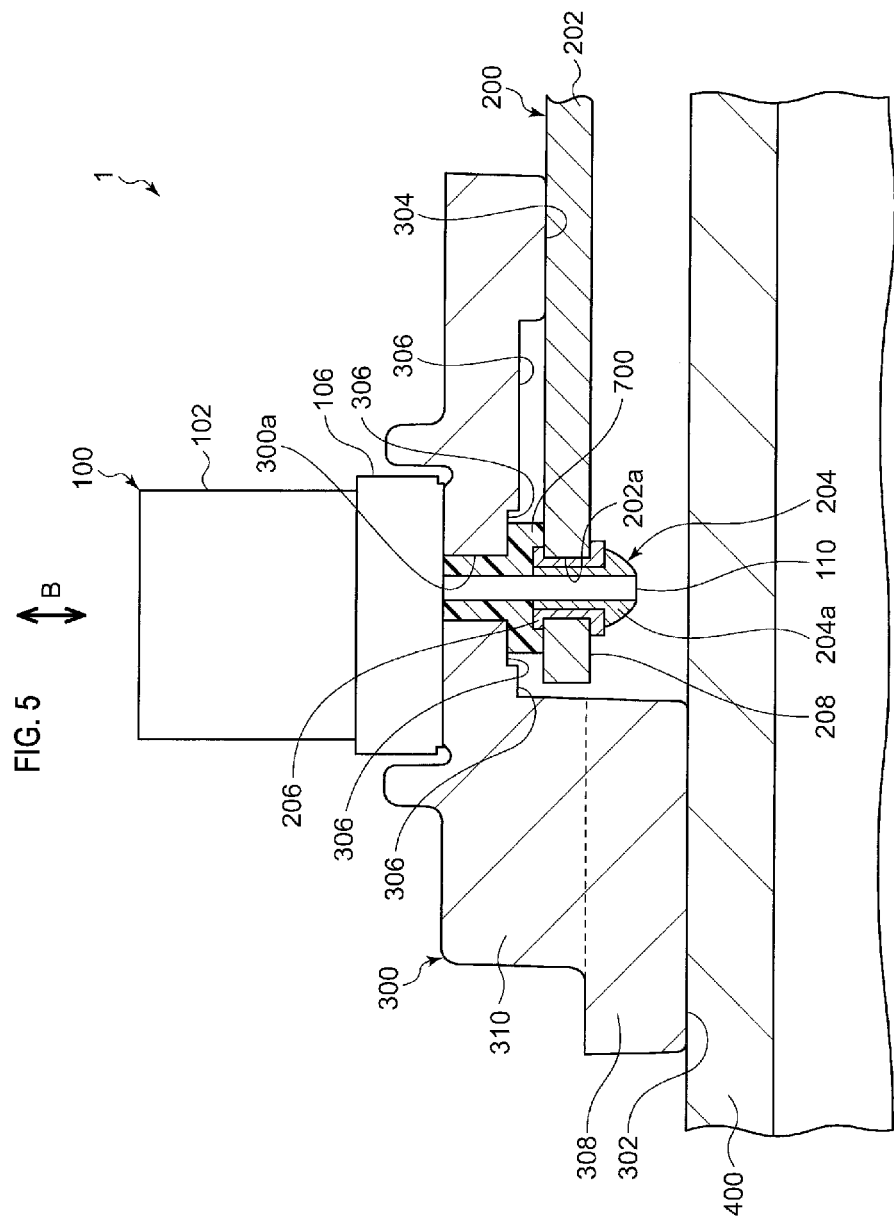
FIG. 5 is an enlarged sectional view showing the vicinity of a connection portion of a light source module according to a second embodiment.

FIG. 5 is an enlarged sectional view showing the vicinity of a connection portion of the light source module according to the second embodiment. In FIG. 5, the internal structure of the light source 100 and the portion of the wiring pattern excluding the land portion 206 are not shown. As shown in FIG. 5, the light source module 1 according to the present embodiment includes the flexible member 700, in addition to the configurations described in the first embodiment.

The flexible member 700 is made of an insulation material such as rubber and is disposed between the second surface 306 and the end region 208. Thus, it is possible to more reliably secure electrical insulation between the land portion 206 and the thermal diffusion member 300. Further, in the present embodiment, the flexible member 700 also extends between an inner wall surface of the through hole 300a and the terminals 108, 110. Thus, it is possible to more reliably secure electrical insulation between the terminals 108, 110 and the thermal diffusion member 300.

In the portion of the flexible member 700, which is interposed between the end region 208 and the second surface 306, at least a portion of the surface facing the end region 208 is substantially flush with the first surface 304. That is, the surface of the flexible member 700 facing the end region 208 and the first surface 304 are located in the same plane. Therefore, in the state where the wiring board 200 is fixed to the first surface 304 of the thermal diffusion member 300, the wiring board 200 is in contact with the flexible member 700. In this way, the posture of the wiring board 200 can be stabilized. The flexible member 700 can be elastically deformed enough to absorb the displacement of the end region 208 in accordance with the dimensional change in the thermal diffusion member 300 or the like. Therefore, the end region 208 can be displaced in accordance with the dimensional change in the thermal diffusion member 300 or the like even when the flexible member 700 is in contact with the end region 208. Further, for example, the flexible member 700 can absorb the stress applied to the connection portion 204 when the light source module 1 vibrates by a force from the outside.

Further, since the flexible member 700 is in contact with the end region 208, the first surface 304 can be further spaced apart from the connection portion 204. That is, an extension range of the second surface 306 can be increased. In this way, a support point when the wiring board 200 is elastically deformed can be spaced apart from the end region 208. Therefore, the wiring board 200 is elastically deformed more easily. As a result, it is possible to more reliably alleviate the stress applied to the connection portion 204.

The flexible member 700 is configured such that the portion extending between the second surface 306 and the end region 208 has a dimension in the extension direction of the wiring board 200 greater than the portion extending into the through hole 300a. In this way, the area where the flexible member 700 is in contact with the wiring board 200 can be increased, and hence, it is possible to further stabilize the posture of the wiring board 200.

Third Embodiment

A light source module 1 according to a third embodiment has the same configuration as the light source module 1 according to the first embodiment except that the terminals 108, 110 further have bent portions 108a, 110a. Hereinafter, the light source module 1 according to the third embodiment will be described by focusing on the configurations different from the first embodiment, and a description of the common configurations will be omitted.

Figure 6:
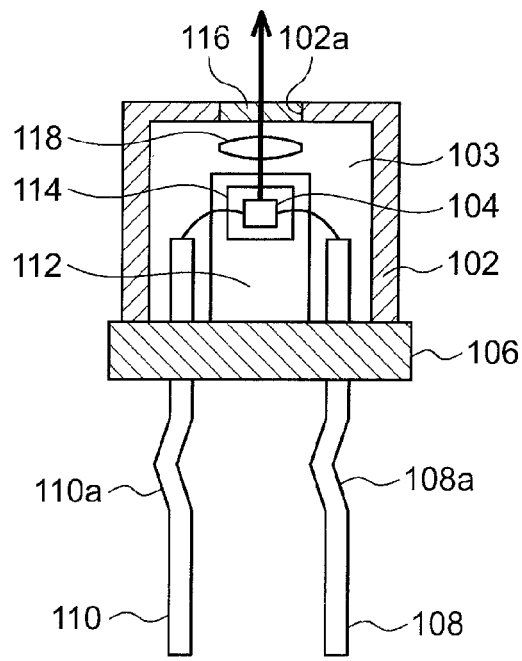
FIG. 6 is a sectional view showing a schematic structure of a light source which is included in a light source module according to a third embodiment.
Figure 7:
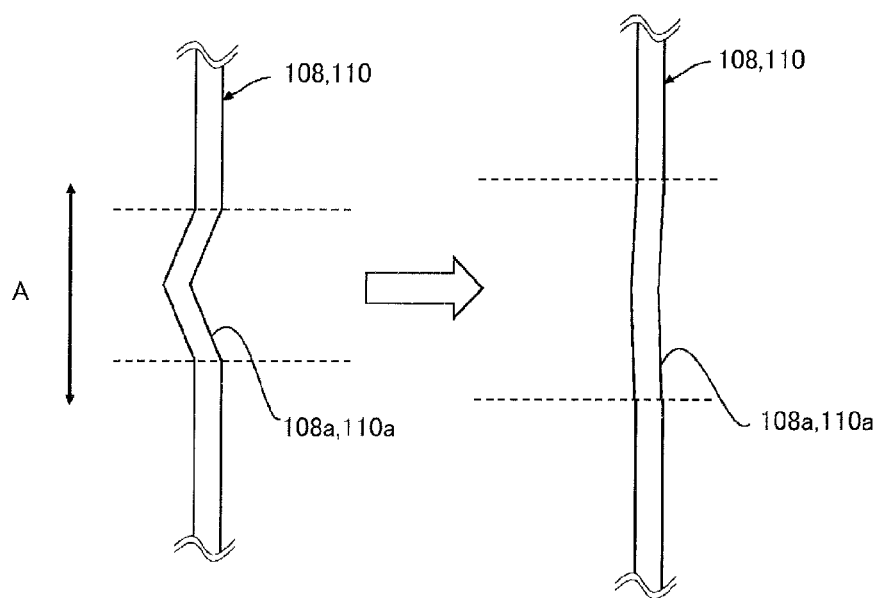
FIG. 7 is a schematic view for explaining deformation of bent portions in accordance with the dimensional change in at least one of a thermal diffusion member, a terminal, a wiring board and a connection member.

FIG. 6 is a sectional view showing a schematic structure of a light source which is included in the light source module according to the third embodiment. FIG. 7 is a schematic view for explaining deformation of the bent portions in accordance with the dimensional change in at least one of the thermal diffusion member, the terminals, the wiring board and the connection member. A left view in FIG. 7 shows a state of the bent portions before deformation and a right view in FIG. 7 shows a state of the bent portions after deformation.

As shown in FIG. 6, the light source 100 included in the light source module 1 according to the present embodiment is configured such that the bent portions 108a, 110a are provided in the terminals 108, 110. The bent portions 108a, 110a are provided on the other end side (on the side opposite to the side connected to an electrode of the light emitting element 104) of the terminals 108, 110 than the stem 106. The bent portions 108a, 110a have a structure that is bent so as to protrude in a direction intersecting with a direction in which the light source 100 and the wiring board 200 are arranged. That is, the bent portions 108a, 110a have a spring structure and serve as a stress alleviation mechanism for alleviating the stress applied to the connection portion 204 in accordance with the dimensional change in at least one of the thermal diffusion member 300, the terminals 108, 110, the wiring board 200 and the connection member 204a.

As shown in FIG. 7, the bent portions 108a, 110a are deformed in accordance with the dimensional change in at least one of the thermal diffusion member 300, the terminals 108, 110, the wiring board 200 and the connection member 204a. Specifically, when the force A occurs in accordance with the dimensional change in the thermal diffusion member 300 or the like, the terminals 108, 110 are tensioned in its extension direction, and hence, the bent portions 108a, 110a are deformed in a shape closer to a straight line. In this way, a distance between both end portions of the terminals 108, 110 is increased and a distance between the light source 100 and the connection portion 204 is allowed to be changed in accordance with the dimensional change in the thermal diffusion member 300 or the like. As a result, the stress applied to the connection portion 204 is alleviated. Therefore, it is possible to more reliably suppress connection reliability between the light source 100 and the wiring board 200 from being decreased.

Meanwhile, the bent portions 108a, 110a may have a curved shape. Alternatively, the bent portions 108a, 110a may have a bellows shape. Further, the bent portions 108a, 110a may be configured by a kink that is obtained by squeezing and bending a predetermined region of the terminals 108, 110, or may be configured by a conductive ribbon. Further, the bent portions 108a, 110a may be formed in such a way that leading ends of the terminals 108, 110 protruding from the through hole 202a are folded-back toward the board 202. That is, the bent portions 108a, 110a may be configured by claw portions provided at the leading end portions of the terminals 108, 110.

The present invention is not limited to respective embodiments described above or modifications thereof. The respective embodiments and modifications thereof may be combined, or additional modification such as various design changes may be added to the respective embodiments, based on the knowledge of those skilled in the art. New embodiments which are obtained by such combinations or additional modifications are also included in the scope of the present invention. These new embodiments have the effects of the respective embodiments which are combined and the modifications thereof.

In the light source module 1 according to the first embodiment, both the flexible member 700 and the bent portions 108a, 110a may be provided or only one thereof may be provided. Further, in respective embodiments, the light source 100 may be a laser light source other than a CAN package. Further, the light emitting element 104 may be an LED or the like. Further, in respective embodiments, the posture of the light source 100 relative to the position of the external power supply terminal 600, i.e., an arrangement direction of the terminals 108, 110 is not limited to those shown.

What is claimed is:

1. A light source module comprising:
   a light source comprising:
      a light emitting element,
      a stem configured to support the light emitting element, and
      a terminal having one end electrically connected to the light emitting element;
   a wiring board to which the other end of the terminal is electrically connected and which is configured to electrically connect the terminal to an external power supply terminal; and
   a thermal diffusion member which is disposed between the stem and the wiring board and is thermally connected to the light emitting element,
   wherein the thermal diffusion member comprises:
      a first surface facing the wiring board,
      a second surface facing the wiring board and located at a position spaced apart from the wiring board than the first surface, and
      a through hole extending from the second surface to a surface on the light source side,
   wherein the wiring board is arranged such that an end region of the wiring board is overlapped with the second surface, as seen from a stacked direction of the light source, the thermal diffusion member and the wiring board, and
   wherein the terminal is inserted through the through hole and is electrically connected to the wiring board at the end region.

2. The light source module according to claim 1, further comprising:
   a flexible insulation member disposed between the second surface and the end region.

3. The light source module according to claim 1,
   wherein the wiring board and the terminal are fixed to each other by a connection member, and
   wherein the terminal has a bent portion which is deformed in accordance with dimensional change in at least one of the thermal diffusion member, the terminal, the wiring board and the connection member.

4. The light source module according to claim 1,
   wherein the thermal diffusion member has a connection surface which is connected to a heat sink, and
   wherein the connection surface is located at a position spaced apart from the light source than the wiring board.

* * * * *